United States Patent [19]

Doyle

[11] Patent Number: 5,982,655
[45] Date of Patent: Nov. 9, 1999

[54] METHOD AND APPARATUS FOR SUPPORT OF MULTIPLE MEMORY TYPES IN A SINGLE MEMORY SOCKET ARCHITECTURE

[75] Inventor: Stephen J. Doyle, Durham, N.C.

[73] Assignee: Cisco Technology, Inc., San Jose, Calif.

[21] Appl. No.: 09/163,154

[22] Filed: Sep. 29, 1998

[51] Int. Cl.$^6$ .................................... G11C 5/06
[52] U.S. Cl. ................ 365/63; 365/230.02; 365/189.05; 365/233
[58] Field of Search ................. 365/63, 189.05, 365/233, 230.02

[56] References Cited

U.S. PATENT DOCUMENTS 5,495,435 2/1996 Sugahara .................................. 365/52

OTHER PUBLICATIONS

Motorola, MC 68360 Quad Integrated Communications Controller User's Manual Rev: .1, 9–48.

Primary Examiner—Andrew Q. Tran
Attorney, Agent, or Firm—Cesari & McKenna, LLP

[57] ABSTRACT

An apparatus and method for supporting multiple types and configurations of random access memory devices in a single dual in line memory module (DIMM) socket architecture is provided. Typically, this architecture allows a user to select either SDRAM or EDO to be located in the socket(s) without substantially altering the connectivity between circuit components. A switching arrangement, that can be either active switches or fixed circuit traces, is used to selectively interconnect various control and addressing functions inherent in the microprocessor to appropriate pins of the memory device socket(s) depending upon whether EDO or SDRAM is used. In general, the address lines of the microprocessor are interconnected through a multiplexer and buffer arrangement that divides the address lines into two groups. The address bits are transmitted to the pin connections during each of the row address cycle and the column address cycle of the memory. The interconnections between the multiplexer/buffer and the random access memory are arranged so that a variety of standardized address pin configurations are supported by the same socket.

13 Claims, 6 Drawing Sheets

| PIN NAME | DESCRIPTION |
|---|---|
| OE | OUTPUT ENABLE INPUT (ACTIVE LOW) |
| SEL | SELECT |
| LE | LATCH ENABLE |
| AN1BN2BN | DATA INPUT |
| AN1BN2BN | 3-STATE OUTPUT |
| GND | GROUND |
| $V_{CC}$ | POWER |

B TO A ($\overline{OEB}$ = H)

| INPUTS | | | | | | OUTPUT AN |
|---|---|---|---|---|---|---|
| 1BN | 2BN | SEL | LE1B | LE2B | $\overline{OEA}$ | |
| H | X | H | H | X | L | H |
| L | X | H | H | X | L | L |
| X | X | H | L | X | L | Ao |
| X | H | L | X | H | L | H |
| X | L | L | X | H | L | L |
| X | X | L | X | L | L | Ao |
| X | X | X | X | X | H | Z |

METHOD AND APPARATUS FOR SUPPORT OF MULTIPLE MEMORY TYPES IN A SINGLE MEMORY SOCKET ARCHITECTURE

FIELD OF THE INVENTION

This invention relates to computer memories and more particularly to a method and apparatus for accommodating different types of memories within a single multi-pin socket.

BACKGROUND OF THE INVENTION

Most microprocessor-based computing devices, used to execute a variety of application programs, include a microprocessor and a separate addressable random access memory (RAM) each residing in a separate package or "circuit chip" on a printed circuit motherboard. The memory stores and retrieves data in a matrix according to a predefined addressing scheme. The microprocessor typically accesses data stored in multi-bit words at various locations within the memory over corresponding multi-bit address lines. According to the addresses provided to the memory, data words are output over an output bus that is, in turn, interconnected with the microprocessor and with a variety of other data handling devices both on the board and remote from the board.

To facilitate assembly, maintenance and replacement of computing components, each circuit chip package is applied to a multi-pin socket that is, in turn, permanently mounted on the motherboard. One popular socket arrangement for accommodating random access memories is the so-called dual in-line memory module (DIMM) socket. This socket generally defines one hundred individual pin connections in a preferred arrangement. Each pin is at a standardized location on the socket and is designated by a standard "pin number." In general, the microprocessor, DIMM socket and other circuit components are connected by a series of discrete lines that are permanently placed on the motherboard, and that, consequently, are not reconfigurable. In other words, a particular pin of the microprocessor is permanently tied to a particular pin on the DIMM socket. This limits the ability of the dim socket to support memory devices other than those specifically designed to interface with certain interconnections or pins. However, the physical geometry of the dim socket is such that it can support several different types and sizes of memories. For example, the socket can accommodate the popular extended data out random access memory (EDO) available in a plurality of memory densities from 1 megabytes up to 32 or 64 megabytes. The addressing scheme for each of such devices is often slightly different. In particular, each different size, and array configuration (number of rows versus columns) requires more, less or different address pins to be employed. This means that simply attaching different-sized memory into the same DIMM socket on a motherboard will not guarantee that the desired microprocessor address pins are connected with the proper addressing functions of the microprocessor. In particular, each EDO device may contain a different number of row versus column address pins.

The use of the newer synchronous dynamic random access memory (SDRAM) is becoming more popular in a variety of memory device applications. The SDRAM has specific timing and control requirements that differ from EDO and other types of memory. These requirements implicate different pin connections than EDO throughout a variety of sizes and configurations.

Accordingly, it is an object of this invention to provide an apparatus and method for supporting a variety of different memory types, particularly, EDO and SDRAM within a single socket with minimal changes to the underlying socket architecture. The underlying architecture should be simple to configure for the different size memories in either EDO or SDRAM. It should not require excessive amounts of additional software or hardware to enable the configuration.

SUMMARY OF THE INVENTION

This invention overcomes the disadvantage of the prior art by providing a method and apparatus for supporting different types, sizes and configurations of random access memory in a single DIMM socket without altering the underlying physical connectivity between sockets/circuit components. In general, the address lines of the microprocessor are interconnected through a multiplexer and buffer arrangement. The architecture includes a switching arrangement that enables the user to select either inputs used for one memory device type, EDO, or another memory device type, SDRAM. The switching arrangement, as defined herein can include active switches of various types or fixed connections that bridge certain circuit pathway to configure either SDRAM or EDO. These connections can be made at the factory by, for example, populating certain zero-ohm resistors on the memory printed circuit board.

In a preferred embodiment, the microprocessor, or memory controller typically includes specific outputs for controlling SDRAM, and the switching arrangement allows these outputs to be routed to appropriate locations on the DIMM socket. In addition, the multiplexer divides the connected address lines into two groups. The two groups of address bits, so divided, are selectively routed to predetermined pin connections of a DIMM socket that interconnect with predetermined address lines of the resident random access memory. The address bits are transmitted to the pin connections during each of the row address cycle and the column address cycle of the memory. The interconnections between the multiplexer and the random access memory are arranged so that a variety of standardized address pin configurations are supported by the same socket. This, in part, results from standardized locations for address bits for a variety of memory devices, varying primarily in the presence or absence of higher order address bits for rows and/or columns. The architecture of this invention enables the microprocessor to be programmed to operate with a given size of memory, and for the appropriate connections to the desired memory address lines to be already present.

In this manner, the user can select an address type, size and configuration that is appropriate to a particular predetermined memory device without substantially altering the physical connections between the microprocessor and the DIMM socket. The addressing scheme provided by the microprocessor is constant, and the multiplexer to produces the desired addressing scheme at the DIMM socket to accommodate a given memory device. The actual address configuration of the memory device is "transparent" to the microprocessor.

In a preferred embodiment, the random access memory can comprise an extended data out dynamic random access memory (EDO) having a desired size and "width." The microprocessor can comprise an MPC 860 PowerQuicc™ available from Motorola. Multiple sockets can be arranged in parallel in the form of discrete memory banks in separate sockets, having data and address busses arranged in parallel. Control of read/write, column and row addressing functions can also be arranged in parallel. In a typical arrangement, row address strobe (RAS) functions are used to select between particular memory banks/sockets, enabling each selected bank at a predetermined time.

BRIEF DESCRIPTION OF THE DRAWINGS

The foregoing and other objects and advantages of the invention will become more clear with reference to the following detailed description as illustrated by the drawings in which.

DETAILED DESCRIPTION OF AN ILLUSTRATIVE EMBODIMENT

Figure 1:
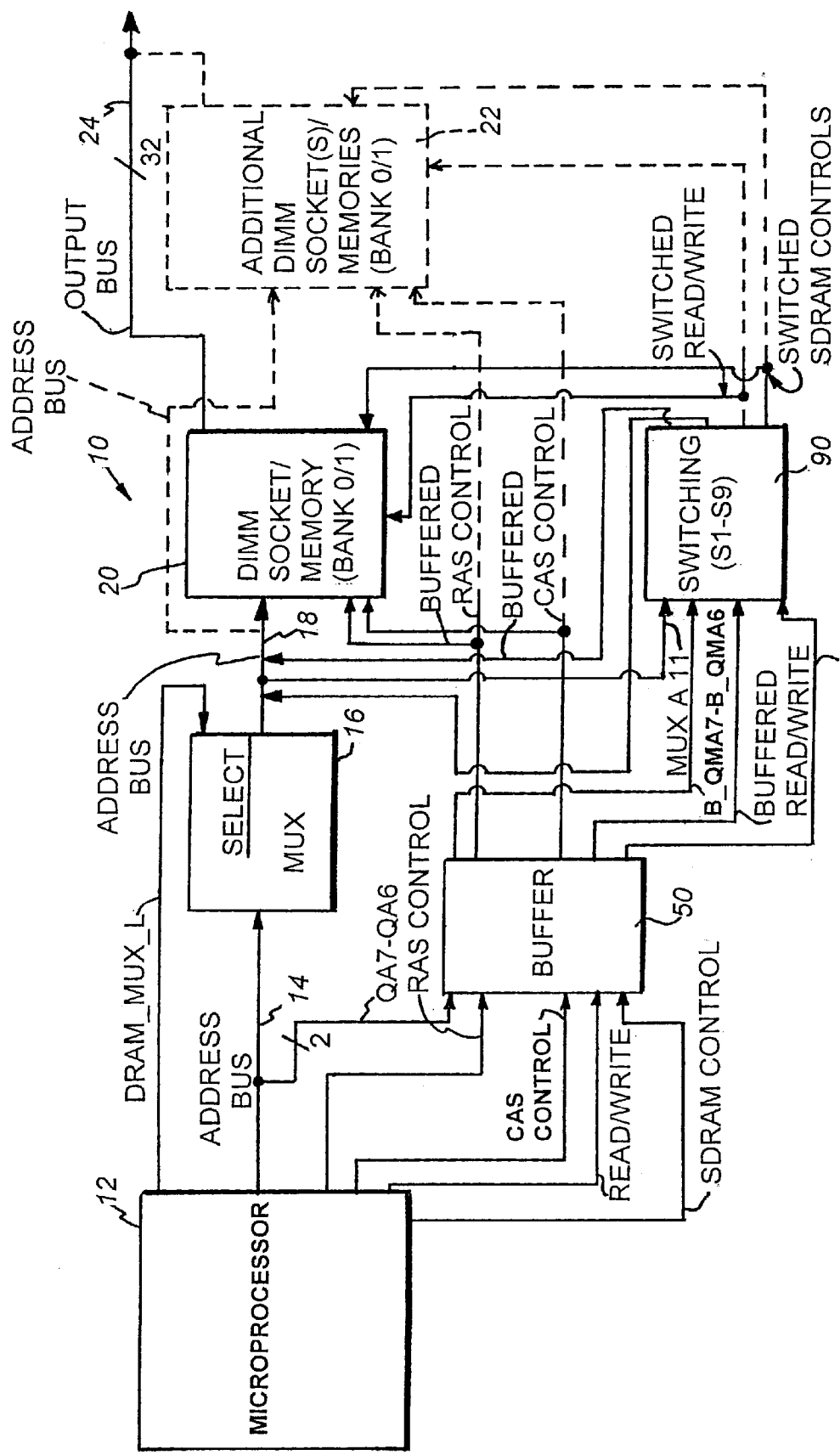
FIG. 1 is a block diagram of a system for addressing multiple types and configurations memory devices in a single DIMM socket according to this invention.

FIG. 1 shows an overall system for accommodating a plurality of memory devices in a single DIMM socket according to a preferred embodiment of this invention. The socket 20 is configured with pin locations according to Joint Electron Device Engineering Council (JEDEC) standard No. 21-C, found at Page 4.4.8-1 of the JEDEC standards book. The illustrated socket 20 is a Molex 71251-5101 according to this embodiment, but DIMM sockets from other sources can be employed. These DIMM sockets generally should be 100-pin sockets in family that supports dynamic RAM (DRAM) including EDO, synchronous dynamic RAM (SDRAM) and read only memory (ROM). The system 10 includes a microprocessor 12. The microprocessor in this embodiment is an MPC 860 PowerQuicc™ available from Motorola. It is contemplated that a variety of different types of microprocessors can be used in conjunction with the system of this invention if the particular well-known standards for addressing, clock, etc. are accommodated so that these other microprocessors perform within the spirit and scope of this invention. The is MPC 860, hereinafter referred to generally as "the microprocessor," can be configured to provide multiplexed memory address outputs based upon internal configurations. Note that this model of microprocessor is particularly designed to support both EDO and SDRAM. Specific outputs are provided to control each type of memory device. These outputs are enabled, either automatically, or by initial setup of the microprocessor to control either EDO or SDRAM. In this embodiment, the microprocessor 12 is also configured so that addresses are multiplexed externally. In other words, addresses are output from the microprocessor in a conventional pattern on a long word boundary.

A multi-bit address bus 14 transfers address signals to the multiplexer 16 according to this invention. Similarly, a multiplexed address bus 18 transmits multiplexed address signals to the DIMM socket 20, which includes a selected EDO or SDRAM memory having a predetermined size and configuration according to this invention. While EDO and SDRAM are selectively employed in a preferred embodiment is contemplated that other types of memory can be adapted to function according to this invention. These EDOs and SDRAMs of various sizes shall be referred to generally as "the memory." An optional additional memory 22 (shown in phantom), or a multiplicity of additional memories, can be provided in parallel banks to the base DIMM socket/memory 20. All memories in a bank output addressed data on a shared multi-bit output bus 24 that transmits the addressed data back to the microprocessor 12 and to other on-board and remote devices.

A variety of memory device sizes and configurations can be used in conjunction with the system of this embodiment. The following table refers to some types of memory (specifically EDO) that are readily supported according to this invention. Note particularly the well-known address ordering scheme in which A29 is the least significant bit and A8 is the most significant bit:

| TOTAL MEMORY SIZE (X 32) | DEVICES EMPLOYED | REFRESH | ROWS | COLUMNS |
|---|---|---|---|---|
| 1 Mbyte | 256K × 4 | 512 | 9 | 9 |
| 1 MByte | 256K × 16 | 512 | 9 | 9 |
| 1 MByte | 256K × 16 | 1K | 10 | 8 |
| 2 Mbyte | 512K × 8 | 1K | 10 | 9 |
| 4 Mbyte | 1 Mbyte × 16 | 1K | 10 | 10 |
| 4 Mbyte | 1 Mbyte × 4 | 1K | 10 | 10 |
| 8 Mbyte | 2 Mbyte × 8 | 2K | 11 | 10 |
| 16 Mbyte | 4 Mbyte × 4 | 4K | 12 | 10 |
| 16 MByte | 4 Mbyte × 4 | 2K | 11 | 11 |
| 16 Mbyte | 4 Mbyte × 16 | 4K | 12 | 10 |
| 32 Mbyte | 8 Mbyte × 8 | 8K | 13 | 10 |

Each of the foregoing EDO memories can be accommodated within a one hundred-pin DIMM socket. As noted above, however, the configuration of address lines in each do not always correspond. Some applications require two or more devices to make up a full thirty-two bit configuration. Also, one or more additional DIMM sockets like the socket 22 (shown in phantom) may be required for additional applications. In general each socket can support two separate banks of memory thereon. For the purposes of this description such banks shall be referred to as Bank0 and Bank1 within each socket 20 and 22. Each bank can be independently enabled as further described below. The refresh speed of various memory devices also varies. Refresh speeds of 1K, 2K or 4K may be required. A refresh speed of 4K is a common multiple. Hence, for the purposes of this embodiment, the refresh speed of 4K is programmed into the microprocessor. Where devices have an 8K refresh requirement, the program can deliver this as a minimum device refresh speed. Note that the above table applies to EDO. SDRAM utilizes a different technique for recharging the memory array that involves given combination of signals that differ from conventional refresh and that are provided according to well-known manufacturing specifications.

The memories used herein are addressed by the microprocessor (or a memory controller) for reading or writing operations according to a specific addressing cycle. This cycle will be described further below. In general, the cycle consist of an addressing of rows and columns of the memory array at different times using the same set of address inputs (A0–A12 for example). Complete row and column addressing requires that a row address strobe signal (RAS), a column address strobe signal (CAS) each be asserted in sequence at a predetermined time. During each RAS and CAS signal, addresses are provided by the address bus 16 of the microprocessor, to be read by the memory device 20. RAS and CAS control signals for operating the memory 20 are provided by the microprocessor over multi-bit control lines 26 and 28, respectively, extending between the microprocessor and the memory (or memories). A buffer 50 is connected along the RAS and CAS lines for delay-matching and signal-boost purposes as will be described further below. This buffer also handles non-multiplexed address signals QA7 and (optional) QA6 also described below. As will again be described below, the RAS signal is used to enable a specific memory in a bank of two or more memories in each of the sockets 20 and 22. In this embodiment, a first memory 20 is designated Bank0. A second memory is designated Bank1. Either is selected, based upon the RAS signal configuration. In addition, the state of the RAS signal selects the specific socket to be addressed (20 or 22). In this arrangement, the CAS signal is unaltered, regardless of the memory bank or socket being selected.

With reference also to FIGS. 2–6, the operation of the multiplexer 16 is further described. The diagram of FIG. 2 includes both the conventional signal/line names for each depicted circuit input and output, and a corresponding conventional socket pin number. The term TP denotes an unused pin or "test-point" and all resistors are designated by their respective resistance value in ohms. In addition, pin connections (and their underlying functions) on individual circuit components that are not used according to this embodiment are not shown. In some instances, highly conventional connections such as power, clock, chip enable, etc. may not be shown, but are assumed to be connected in a well-known manner. Also, the conventional (manufacturer's) names for each individual chip/socket connection (e.g. RAS0–RAS3, SEL, OE, WE) are shown within the block representing the chip/socket adjacent the corresponding pin number.

The multiplexer 16 of this embodiment comprises a D-type latch device configured as a 12/24-bit wide unit. This embodiment employs a model 74ALVCH16260 circuit commercially available from Pericom Semiconductor of San Jose, Calif. for the multiplexer 16. This device defines the specific pin configuration 100 detailed in FIG. 3. The designation of various pins is further defined in the table 400 at FIG. 4. For the purposes of this description reference can be made to the manufacturer's data specifications found in publication PS8089A dated Mar. 25 1997. In general, the microprocessor's address line inputs denoted QA8–QA29 (QA29 being the least significant bit) are carried on corresponding inputs 1B1–1B12 (1BN) and 2B1–2B12 (2BN) according to the connection order shown in FIG. 2. Input QA7 is carried separately as discussed immediately below. In particular, least significant address bit QA29 and adjacent bit QA28 are carried together on 2BN, with successive bits alternating by twos. Next adjacent bits QA27 and QA26, and successive alternating bits are carried on 1BN. 1B1 also carries the QA8 address input along with 2B2. Microprocessor address inputs QA7 and QA6 are also routed to the socket 20. As will be described further below, these values are routed through buffer 40 rather than through the multiplexer 16. In general, QA7 enables the use of a memory device in the socket 20 having a 13-row by 10-column configuration. Hence, this enables support of an 8Mbyte×8 EDO with 8K refresh speed. Note that four banks of such 8Mbyte×8 devices yields a 128 Mbyte DIMM arrangement on a given circuit board.

The address QA 6 is also connected via the buffer 50 to the socket 20. This address is provided for upgrades that include wider address boundaries.

The order of multiplexed addresses is particularly defined as follows according to a preferred embodiment:

| MULTIPLEXER INPUT | MICROPROCESSOR ADDRESS LINE |
|---|---|
| 2B12 | QA29 |
| 2B11 | QA28 |
| 2B10 | QA24 |
| 2B9 | QA22 |
| 2B8 | QA20 |
| 2B7 | QA18 |
| 2B6 | QA16 |
| 2B5 | QA14 |
| 2B4 | QA11 |
| 2B3 | QA10 |
| 2B2 | QA8 |
| 2B1 | Not Used |
| 1B12 | QA27 |
| 1B11 | QA26 |
| 1B10 | QA25 |
| 1B9 | QA23 |
| 1B8 | QA21 |
| 1B7 | QA19 |
| 1B6 | QA17 |
| 1B5 | QA15 |
| 1B4 | QA13 |
| 1B3 | QA12 |
| 1B2 | QA9 |
| 1B1 | QA8 |

The unused multiplexer input 2B1 is tied to ground via a 220 ohm resistor. To achieve the proper input/output setup, the multiplexer's latch enable inputs LE2B, LE1B, LEA2B and LEA1B, and B2N and B1N inverse output enable inputs OE2B and OE1B are tied to power of +3.3 V via a 4.7K ohm resistor. Similarly, the AN inverse output enable OEA is tied to ground via a 220 ohm resistor.

Figure 2:
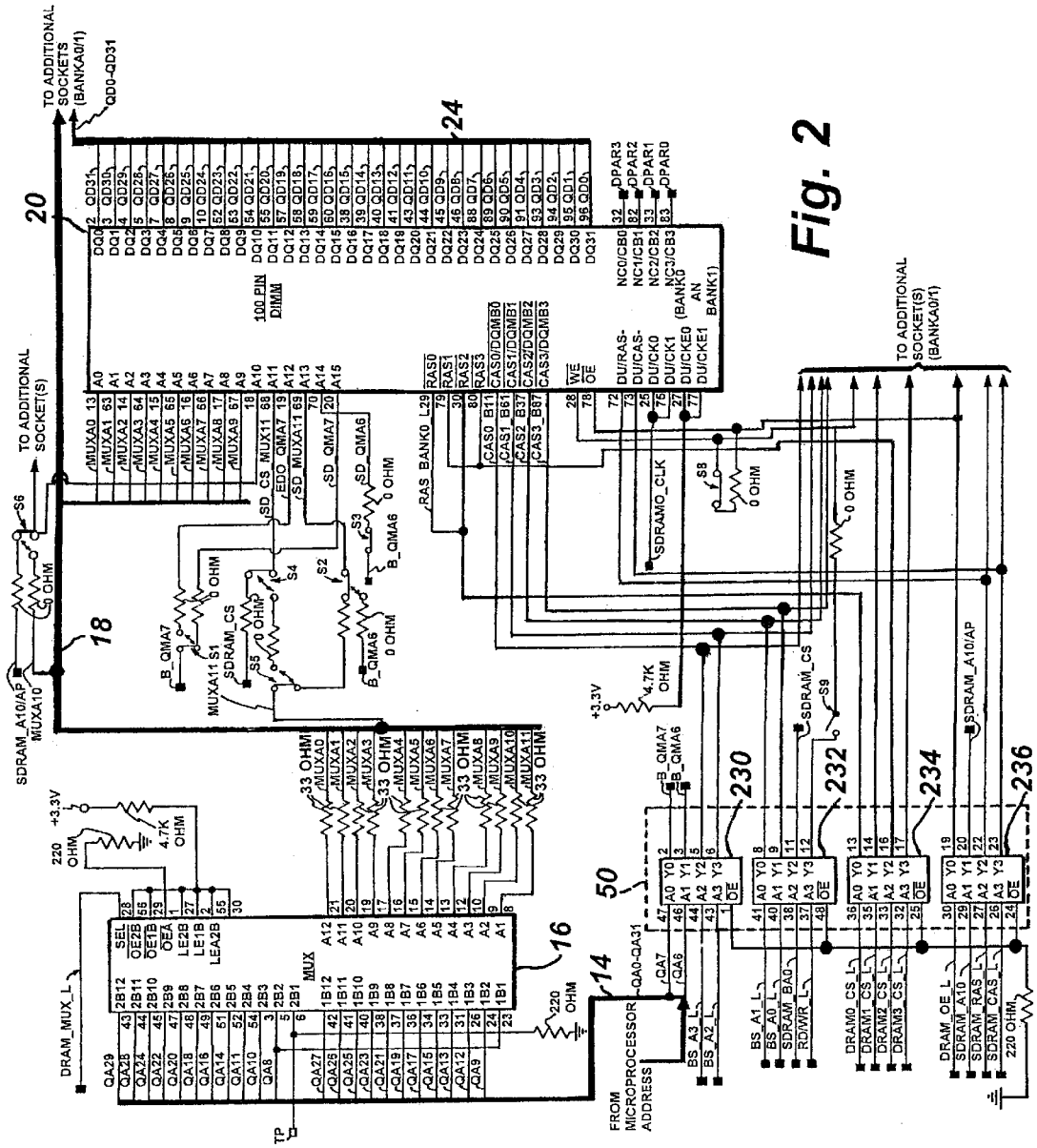
FIG. 2 is a more detailed schematic diagram of the system of FIG. 1.
Figures 3, 4:
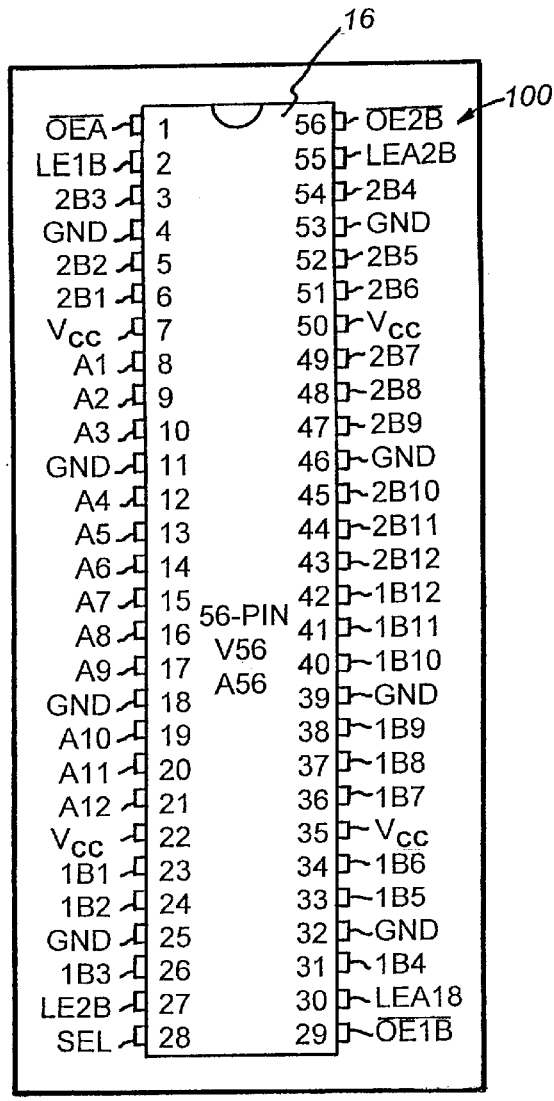
FIG. 3 is a pin diagram of a multiplexer for use with the system of FIG. 1 and 2.
FIG. 4 is a table defining pin designations of the multiplexer of FIG. 3.

The selecting signal DRAM_MUX_L (where "L" signifies a logical "Low" for assertion) is used to selectively drive the multiplexer's select input (SEL) to cause selected address values 1BN or 2BN to alternatively be output on output lines A1–A12 (AN). These values are carried to the DIMM socket 20 as multiplexed address lines MUXA0–MUXA11. It has been determined that, for the various memory devices shown in the table above, appropriate assertion of DRAM_MUX_L in either a high or low state provides the proper configuration of multiplexed addressed signals MUXA0–MUXA10 at the DIMM socket inputs A0–A10, respectively, so as to accommodate the given EDO or SDRAM installed in the socket. In other words, when the designated pins shown in FIGS. 2 and 3 are interconnected, the relationship of inputs (1BN and 2BN), defined in the truth table 500 of FIG. 5 will provide appropriate outputs (AN) to accommodate each of the variety of memory devices. Note, the table 500 uses H to signify a high logic state, L to signify a low logic state, X to signify an irrelevant notation and Z to signify a high impedance state (e.g. no signal from this output). Again, the multiplexer's output is particularly based upon the logical state of select (SEL) as governed by DRAM_MUX_L. In the preferred embodiment, the following relationship between multiplexer output and DIMM device address input is established:

| MULTIPLEXER OUTPUT | SIGNAL | MEMORY ADDRESS INPUT |
|---|---|---|
| A12 | MUXA0 | A0 |
| A11 | MUXA1 | A1 |
| A10 | MUXA2 | A2 |

-continued

| MULTIPLEXER OUTPUT | SIGNAL | MEMORY ADDRESS INPUT |
|---|---|---|
| A9 | MUXA3 | A3 |
| A8 | MUXA4 | A4 |
| A7 | MUXA5 | A5 |
| A6 | MUXA6 | A6 |
| A5 | MUXA7 | A7 |
| A4 | MUXA8 | A8 |
| A3 | MUXA9 | A9 |
| A2 | MUXA10 | A10 |

The microprocessor address outputs of QA7 and QA6 (optional up-grade/expansion signal) are connected through a switching arrangement that is shown as a generalized block 90 in FIG. 1 following a buffer 50. The buffered outputs from QA7 and QA6 are respectively termed B_QMA7 and B_QMA6. With further reference to FIG. 2, the signal B_QMA7 is routed through a switch S1. This switch can, in fact be any of a variety of structures that enables a pair of input lines to be selected either during field use or at the manufacturing facility. For example, each of the switches to be described can be a jumper, dip switch or semiconductor switching unit. In addition a switch can be a pre-formed trace laid down during the manufacture of the printed circuit board. The trace can be made to either of two existing pathways, and is chosen at the time of manufacturing. Each pathway includes a 0-ohm resistor that can act as the bridge to complete a desired pathway. Briefly, each switch is set to support either an EDO or SDRAM resident in the socket(s) 20 (and 22). The drawing in FIG. 2 shows all switches S1–S8 set to enable an SDRAM in the socket(s). The mounting of an EDO in the socket(s) requires the opposite setting for switches with respect to that shown in FIG. 2.

Referring again to signals B_QMA7, this signal is routed through switch S1 which interconnects with address input A15 in an SDRAM arrangement as signal SD_QMA7. Alternatively, B_QMA7 is interconnected with address input A12 in an EDO configuration as EDO_QMA7 based upon a movement of the switch S1 to complete this alternate circuit pathway.

B_QMA6 is routed from the buffer section 230 to two switches S2 and S3. In an SDRAM arrangement, the switch S2 disconnects B_QMA6 from the address input A13, and instead allows the multiplexed signal MUXA11 to be transferred to A13 as SD_MUXA11. Another switch S5 routes MUXA11 to either address input A11 as SD_CS_MUX11 or to address input A13 as SD_MUXA11. A13 is chosen by switches S2 and S5 in an SDRAM arrangement. Conversely A11 is chosen by switches S4 and S5 in an EDO arrangement. Likewise, a buffered SDRAM select signal (inherent in the SDRAM control outputs of the microprocessor) SDRAM_CS is routed by switch S4 to input A11 as SD_CS_MUX11 in an EDO arrangement. In an SDRAM arrangement, the other input for B_QMA6 is routed to input A14 by a closed switch S3. Conversely, in an EDO configuration, switch S3 is open, and A14 receives no signal.

Memory address input A10 receives the buffered signal SDRAM_A10/AP via a closed switch S6 in an SDRAM arrangement. The buffered signal SDRAM_A10/AP derives from a signal SDRAM_A10 which is an inherent microprocessor output for controlling address A10 in SDRAM mode. In an EDO arrangement, the switch S6 is configured to transmit the multiplexed signal MUXA10 from the multiplexer 16 to memory address input A10.

It is expressly contemplated that a different microprocessors, memory controllers and memory arrays may require a different multiplexer configuration. Other commercial or customized multiplexer (such as programmable logic arrays) can be employed where appropriate.

With reference again to FIG. 2, the RAS and CAS control is effected by a series of control signals that are routed through a set of parallel buffers 230, 232, 234 and 236. These buffers comprise four discrete buffer circuits on a multi-pin integrated circuit package 50 available from Pericom Semiconductor (or other suppliers) as model number 74LVT162244. Each buffer input line A0–A3 produces an output Y0–Y3 respectively, having the same logical state. While the depicted buffers 230, 232, 234 and 236 can be omitted in some applications, they serve to equalize the timing of signals from the microprocessor to the memory with respect to the multiplexer 16. In addition, where a bank of two or more memory devices are employed together, the buffers serve to provide sufficient signal strength in view of the internal impedance present in the memory bank to ensure adequate propagation of the buffered signals.

Figures 5, 6:
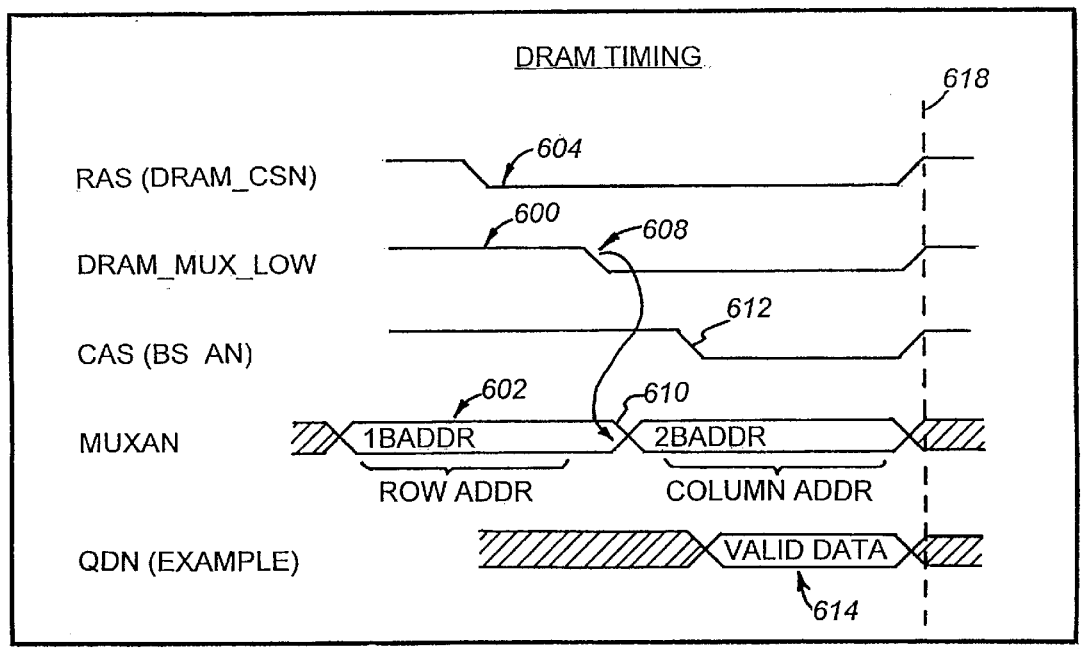
FIG. 5 is a truth tables defining logic states of the multiplexer of FIG. 3.
FIG. 6 is a timing diagram of the addressing cycle for an EDO memory device used in the system of FIGS. 1 and 2.

Reference is made first to the timing diagram in FIG. 6 which defines an EDO addressing process. In general, DRAM_MUX_L begins in a high (deasserted) state 600. Various row addresses (MUXAN) are shown as either high or low 602 at this time. The RAS selection signal (DRAM_CSN) is asserted 604. This causes the memory to address the various rows identified by MUXAN. These rows are present on the 1BN inputs of the multiplexer 16. These inputs are allowed to pass through during the RAS phase of the cycle. Subsequently, DRAM_MUX_L becomes a low signal 608. A cross over occurs 610 in MUXAN and now the 2BN addresses are allowed the pass through the multiplexer 16. Subsequent to the cross over 610 the CAS signal (BS_AN) becomes low 612. At this time both row and column signals are transmitted in a cycle to the memory. Note that microprocessor address signals QA7 and QA6 (if used) are routed to the socket via the buffer (as respective buffered signals B_QMA7 and B_QMA6) while both the 1BN and 2BN mutiplexer inputs are routed to the socket. This results in a valid data bit 614 on each of the data lines QDN. The actual timing of valid data is an example since the timing for a read cycle generally differs from that of a write cycle. Following the reading or writing by the microprocessor and other devices of the valid data word 614, the cycle begins again at the time 618. The signals RASN, CASN, and DRAM_MUX_L each become high again, awaiting restart of the cycle for the next data word to be addressed.

With further reference to the buffer bank 50, containing the individual buffers 230, 232, 234 and 236, the control of the memory's RAS, CAS and read/write enable inputs is now described (see also FIGS. 1 and 2). Each of these signals is routed through one of the bank of buffers to provide a timing match with the multiplexer 16, and also to allow increased driving capability where a bank of two or more memories are employed. The microprocessor includes four conventional byte select outputs. These are asserted as signals BS_A3_L, BS_A2_L, BS_A1_L and BS_A0_L. These signals are used to enable conventional CAS signals CAS0, CAS1, CAS2 and CAS3, respectively on the memory according to known protocols.

Conventional chip selects on the microprocessor generate signals DRAM0_CS_L, DRAM1_CS_L, DRAM2_CS_L and DRAM3_CS_L, each passed through the buffer 234. DRAM0_CS_L is interconnected with RAS0 and RAS2 on the memory. This RAS signal is configured to select the memory socket 20 when needed. As noted there are two banks (Bank 0 and Bank1) available in each socket. When DRAM0_CS_L becomes low at the beginning of the RAS cycle, it enables Bank 0 on socket 20. Otherwise this signal remains high. DRAM2_CS_L is interconnected with RAS1 and RAS3 of memory socket 20. These RAS inputs enable Bank1 of socket 20 when they receive a low signal from DRAM2_CS_L. Note that DRAM1_CS_L is interconnected with RAS0 and RAS2 (actual connection not shown) of the next socket 22 (Bank 0) and DRAM3_CS_L is likewise connected with RAS1 and RAS3 of the next socket (Bank 1). The appropriate assertion of DRAM1_CS_L and DRAM3_CS L signals, hence, selects Bank 0/Bank1 of socket 22 rather than Bank 0/Bank1 of socket 20. In general each existing socket and bank is enabled in turn by asserting the appropriate RAS signal. Other sockets and banks (not shown) can be controlled by further combining and/or multiplexing the chip select inputs to select specific sockets/banks based upon the particular combination of RAS signals.

The buffer 232 is interconnected with the microprocessor's read/write select signal denoted as RD/WR_L. The derived buffered signal is then interconnected with the inverse memory write enable signal WE. A switch S9 (see FIG. 2) allows this signal to be disconnected in an SDRAM arrangement. In an EDO arrangement, a write operation can occur over the memory data lines when the signal RD/WR_L is asserted low. Likewise, the buffer 236 receives the read/output enable signal DRAM_OE_L, which is then connected to the inverse output enable OE on the memory. When this signal is asserted low, the data lines output an addressed word in an EDO arrangement. Again, a switch S8 remains open during an EDO arrangement to prevent the buffered signal DRAM_OE_L from being routed to WE. In an SDRAM arrangement, the reverse is true, and DRAM_OE_L is routed also to WE. This is described further below.

Finally, each socket contains four parity bit outputs DPAR0–DPAR3. These outputs allow error checking using a well-known parity technique. EDO generally utilizes such a technique, and appropriate connections are made to carry out the parity function. Other types of memory may not utilize the parity function. In particular, SDRAM does not utilize the parity function.

Figure 7:
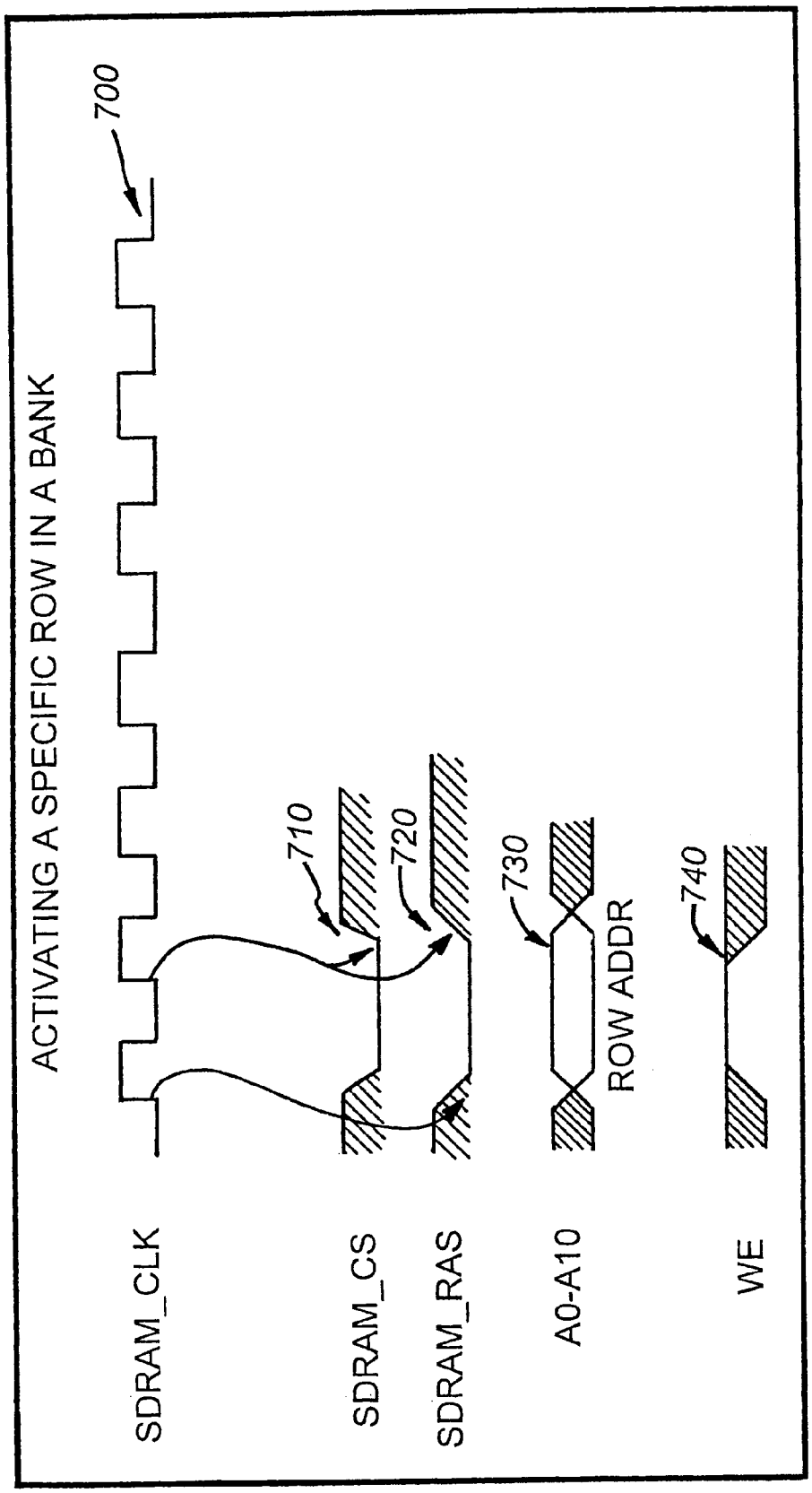
FIGS. 7–9 are timing diagrams of the addressing cycle for an SDRAM memory device used in the system of FIGS. 1 and 2.
Figure 8:
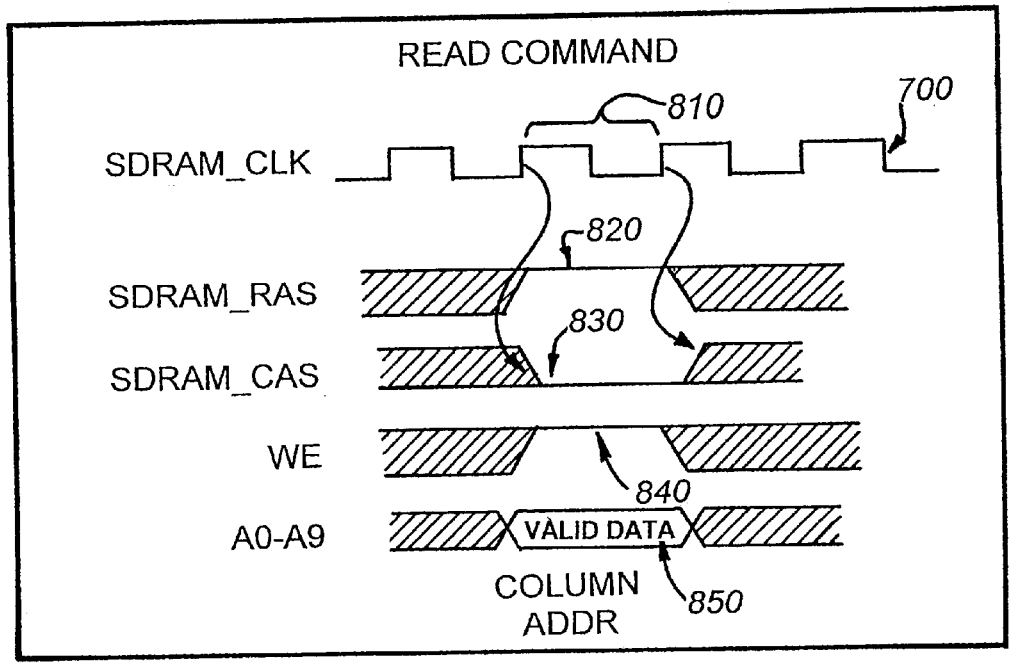
Figure 9:
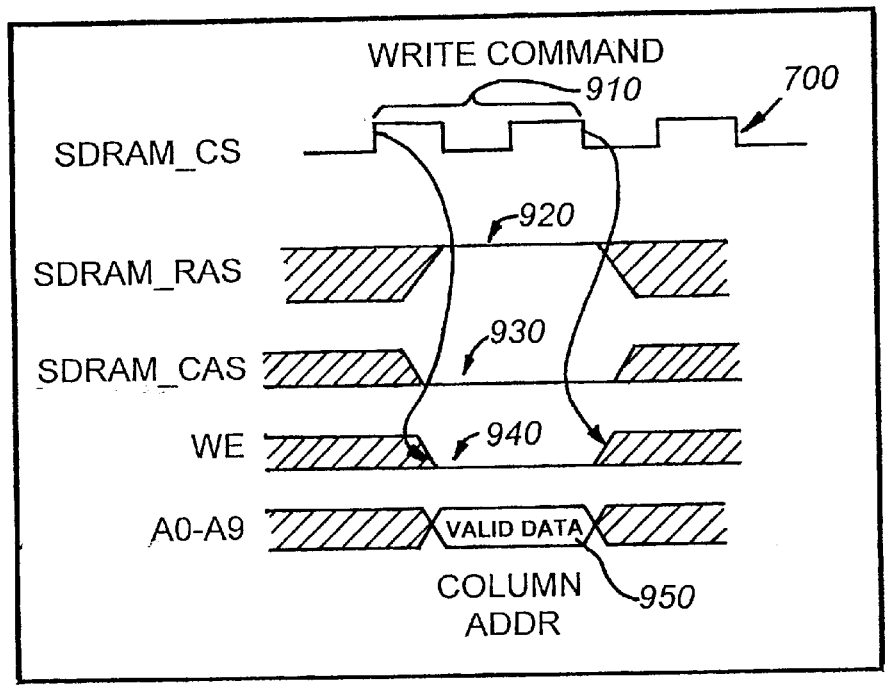

Now referring also to FIGS. 7–9, control and addressing of an SDRAM arrangement is now described. The SDRAM clock signal SDRAM_CLK provided by an appropriate clock signal generator (not shown) provides a constant wave for driving the SDRAM addressing and read/write operations via socket inputs DU/CLK0 and DU/CLK1 (see FIG. 2) for each of Bank0 and Bank1, respectively. The clock signal 700 in this embodiment is set to a frequency of approximately 38.976 Mhz, but other speeds are expressly contemplated. The clock enable inputs DU/CKE0 and DU/CKE1 (for Bank0 and Bank1, respectively) are tied high using a 4.7K ohm resistor connected to a 3.3 volt power source.

The select signal SDRAM_CS (710 in FIG. 7) is asserted low to enable a particular row to be activated in a desired SDRAM device. This signal is derived from the bank select signal SDRAM_BA0 generated by the microprocessor as part of the available SDRAM controls. The RAS signal SDRAM_RAS_L is also asserted low (720) to select the appropriate socket 20, 22 and bank (Bank0, Bank1). The select and RAS signals are asserted for one complete clock cycle. During this time the desired row address (A0–A10) is provided (730). The write enable is held high (740) at this time, inhibiting a write operation. Note that SDRAM does not utilize a read or output enable. Thus, referring also to FIG. 2, switch S8 is closed in an SDRAM arrangement to jump the buffered DRAM_OE_L signal to the read/output enable input OE on the socket 20 (and 22). In addition, switch S9 is held open in an SDRAM arrangement since RD/WR_L is not used to write enable WE on the socket 20 (and 22). Switches S8 and S9 are reversed in an EDO configuration as described above, to allow RD/WR_L to enable the input WE.

On the next clock cycle 810 (FIG. 8) or 910 (FIG. 9), a respective read or write operation is completed. The RAS signal SDRAM_RAS_L is now high (820 or 920) and CAS signal SDRAM_CAS_L is asserted low (830 or 930) to access the valid data (850 or 950) of the addressed columns (A0–A9 in this example) associated with the rows selected in accordance with FIG. 7. In the case of a read operation, the WE input remains high (840 in FIG. 8) disabling the write function. In the case of a write function, the WE input receives a low signal (940 in FIG. 9) enabling the write function, and allowing the addressed row and columns to have input a data word over the data bus 24 (FIGS. 1 and 2). The cycle continues as described in FIGS. 7–9 until all SDRAM device banks/sockets have been addressed. Note that banks in SDRAM are selected using SDRAM_CS derived from the bank select signal of the microprocessor SDRAM_BA0.

Note that SDRAM_RAS_L and SDRAM_CAS_L are generated by the microprocessor as part of its inherent functions for controlling SDRAM. Each signal is routed to a specific, respective input DU/RAS and DU/CAS on the socket(s) 20 (and 22). Refer to FIG. 2.

With reference again to FIG. 2, all control and data lines that are shown interconnecting with additional memory sockets (socket 22, etc.) can be assumed to be tied to identical pin connections and perform identical functions as those described for socket 20.

Note that the use of both switching and multiplexing of address lines makes possible the ability to support both EDO and SDRAM according to this embodiment. In addition, multiplexing makes possible the support of a variety of configurations and sizes of memory devices of both types (EDO or SDRAM).

Finally, a system that employs the foregoing architecture can be made to automatically recognize the size and configuration of memory device(s) being installed in the socket (s) by undertaking the following memory recognition steps upon system boot-up (Note, the user has already configured the system to receive either SDRAM or EDO when recognition begins, otherwise recognition of memory type must also be performed at this time so that switches can be set):

1. The system addresses the base memory location (e.g. row0 and column0) in each socket and each bank to determine whether any data is retrieved. If so, then the system has recognized whether and where each discrete memory device is located.

2. The system begin polling memory addresses in, for example 1-megabyte increments to determine if data is present at each address. When data is no longer present, then the row/column boundary for each device populating the memory circuit board has been determined.

3. These values are stored in the microprocessor or memory controller memory for future use.

The foregoing has been a detailed description of a preferred embodiment of this invention. Various modifications and additions can be made without departing from the spirit and scope of this invention. For example, the specific configuration of pin interconnections to the memory socket can be varied based upon the type of memory being employed. While a memory comprising conventional EDO or SDRAM types are shown herein, other types of memories may employ different standards for pin configuration and control. The pin connections described herein can be altered to service a particular standard. The number of sockets/ banks of memories can be altered depending upon the application, and the size of memory in each bank may be varied independently. While it is contemplated that the hardware configuration detailed herein can operate according to an existing memory control protocol, in some embodiments, modified memory control software may be necessary or desirable. Certain well-known control signals such as SDRAM precharge are not shown, but should be provided in a manner known to those of ordinary skill. Finally while the tables described herein make specific reference to EDO memory address configurations and sizes, the principles outlined herein enable a variety of sizes of SDRAM to be supported. As noted above, SDRAM generally uses a constant number of row address inputs regardless of column width. This simplifies the description of the array configuration such devices. Furthermore, while control and address functions are provided by the microprocessor as described herein, the term "microprocessor" should be taken to include a separate memory controller as well, that may control some or all of the functions associated with either an EDO or SDRAM. Accordingly, this description is meant to be taken only by way of example, and not to otherwise limit the scope of the invention.

What is claimed is:

1. An apparatus for supporting a first type of random access memory and a second type of random access memory each being selectively connected to a predetermined multi-pin memory socket comprising:
   a plurality of memory address lines interconnected with a microprocessor each defining an individual address bit from a least significant bit to a most significant bit and a plurality of memory control lines interconnected with the microprocessor for controlling each of the first type of random access memory and the second type of random access memory;
   a first memory device socket receiving each of the first type and the second type of random access memory, the first memory device socket having a plurality of individual pin connections including first memory address pin connections for addressing the first type and first memory control pin connections for controlling the first type and also including second memory address pin connections for addressing the second type and second memory control pin connections for controlling the second type; and
   a switch assembly that selectively connects predetermined of the memory address lines to either of the first memory address pin connections and the second memory address pin connections and that selectively connects predetermined of the memory control lines to either of the first memory control pin connections and the second memory control pin connections, each being based upon whether either of the first type of random access memory and the second type of random access memory is connected to the first socket, respectively.

2. The apparatus as set forth in claim 1 wherein the first type of random access memory is an extended data out memory (EDO) and the second type of random access memory is a synchronous dynamic random access memory (SDRAM).

3. The apparatus as set forth in claim 2 wherein the switch assembly comprises one of either a plurality of switches that are operable by an user and a plurality of circuit traces that are selectively connected to predetermined circuit pathways.

4. The apparatus as set forth in claim 2 further comprising a multiplexer having inputs interconnected with at least some of the plurality of memory address lines and having multiplexer outputs interconnected with at least some of the first memory address pin connections of the first memory device socket and the second memory address pin connections of the first memory device socket, the multiplexer further having a multiplexer select input, interconnected with the microprocessor, for selectively routing address data each of a first group of multiplexer inputs and a second group of multiplexer inputs to the multiplexer outputs in response to a state of the multiplexer select input.

5. The apparatus as set forth in claim 4 wherein each of the first type and the second type of random access memory is addressed according to a row address cycle and a subsequent column address cycle over the memory address pin connections and the multiplexer select input comprises a signal that changes state between the row address cycle and the column address cycle to thereby change the address data transferred from the multiplexer outputs respectively to the first memory device socket.

6. The apparatus as set forth in claim 5 wherein the first group of multiplexer inputs includes each of the least significant address bit and a second address bit directly adjacent to and more significant than the least significant address bit.

7. The apparatus as set forth in claim 6 wherein the second group of multiplexer inputs includes each of a third address bit directly adjacent to and more significant than the second address bit and a fourth address bit directly adjacent to and more significant than the third address bit.

8. The apparatus as set forth in claim 7 wherein the first group of multiplexer inputs includes further address bits following the fourth address bit and alternating by twos in a less significant to more significant order and wherein the second group of multiplexer inputs includes further address bits following the third address bit and alternating by twos in a less significant to more significant order.

9. The apparatus as set forth in claim 2 further comprising a second memory device socket for receiving either of the first type and the second type of random access memory having the plurality of individual pin connections.

10. A method for selectively supporting either of a first type of random access memory and a second type of random access memory connected to a multi-pin memory socket comprising the steps of:
    providing a plurality of memory address lines interconnected with a microprocessor each defining an individual address bit from a least significant bit to a most significant bit and providing a plurality of memory control lines for each of the first type of random access memory and the second type of random access memory interconnected to the microprocessor;
    receiving in a first memory device socket either of the first type and the second type of random access memory, the first memory device socket having a plurality of individual pin connections including first memory address pin connections for addressing the first type and first memory control pin connections for controlling the first type and also including second memory address pin connections for addressing the second type and second memory control pin connections for controlling the second type; and
    selectively switching so as to connect predetermined of the memory address lines to either of the first memory address pin connections and the second memory address pin connections and to connect predetermined of the memory control lines to either of the first memory control pin connections and the second memory control pin connections, each being based upon whether either of the first type of random access memory and the second type of random access memory is connected to the first socket, respectively.

11. The method as set forth in claim 10 wherein the step of receiving includes locating either of the first type of random access memory that comprises an extended data out random access memory (EDO) and the second type of random access memory that comprises a synchronous dynamic random access memory (SDRAM) in the first memory device socket.

12. The method as set forth in claim 11 further comprising providing a multiplexer with multiplexer inputs interconnected with at least some of the plurality of memory address lines and having multiplexer outputs interconnected with at least some of the first memory address pin connections of the first memory device socket and the second memory address pin connections of the first memory device socket and selectively routing address data of each of a first group of multiplexer inputs and a second group of multiplexer inputs to the multiplexer outputs at predetermined times.

13. The method as set forth in claim 12 further comprising enabling a row address cycle and a subsequent column address cycle in the random access memory and selectively routing each of the first group of multiplexer inputs and the second group of multiplexer inputs at times that correspond with each of the row address cycle and the column address cycle respectively.

* * * * *